(12) United States Patent
Olesen et al.

(10) Patent No.: US 11,619,690 B2
(45) Date of Patent: Apr. 4, 2023

(54) MEDICAL SCANNER ACCESSORY SYSTEM AND MEDICAL SCANNER

(71) Applicant: TracInnovations ApS, Ballerup (DK)

(72) Inventors: Oline Vinter Olesen, Herlev (DK); Ole Nerst, Brøndby (DK)

(73) Assignee: TRACINNOVATIONS APS, Ballerup (DK)

( * ) Notice: Subject to any disclaimer, the term of this patent is extended or adjusted under 35 U.S.C. 154(b) by 77 days.

(21) Appl. No.: 17/241,765

(22) Filed: Apr. 27, 2021

(65) Prior Publication Data

US 2021/0247474 A1  Aug. 12, 2021

Related U.S. Application Data

(63) Continuation of application No. 16/465,048, filed as application No. PCT/EP2017/080914 on Nov. 30, 2017, now Pat. No. 11,016,153.

(30) Foreign Application Priority Data

Nov. 30, 2016 (EP) ..................................... 16201439

(51) Int. Cl.
*G01V 3/00* (2006.01)
*G01R 33/28* (2006.01)
(Continued)

(52) U.S. Cl.
CPC ........... *G01R 33/288* (2013.01); *G01R 33/36* (2013.01); *G01R 33/5673* (2013.01); *G02B 6/4458* (2013.01); *H02G 11/02* (2013.01)

(58) Field of Classification Search
CPC .............. G01R 33/3692; G01R 33/307; G01R 33/34007; G01R 33/34046; G01R 33/481; G06T 11/005; G06T 2110/41
(Continued)

(56) References Cited

U.S. PATENT DOCUMENTS 4,478,487 A  10/1984 Obeissart
5,474,068 A  12/1995 Takamori
(Continued)

FOREIGN PATENT DOCUMENTS

CN  202924490 U  *  5/2013
CN  203763691 U  *  8/2014
(Continued)

OTHER PUBLICATIONS

Klarhofer, M et al., "MR-Compatible Optical Tracking Device with Active Markers", Proc. Inti. Soc. Mag. Reson. Med. 13 (2005).
(Continued)

*Primary Examiner* — Walter L Lindsay, Jr.
*Assistant Examiner* — Frederick Wenderoth
(74) *Attorney, Agent, or Firm* — Duane Morris LLP; Gregory M. Lefkowitz; Brandon A. Chan

(57) ABSTRACT

The present disclosure relates to an un-motorized coiling mechanism for cable handling in medical scanning. A medical scanner accessory system for a medical scanner is disclosed. The medical scanner accessory system comprises a base part; a drum part rotatably connected to the base part, the drum part having a rotation axis and configured for accommodating an electronic device; a coiling mechanism comprising a first coiling part and a second coiling part; an elastic cord with a first point attached to the base part and a second point attached to the drum part, wherein the elastic cord is coiled on the coiling mechanism; and a cable comprising a jacket, wherein the cable has a first connector at a first end and a second connector at a second end thereof, wherein the first connector is connectable to a movable part of the medical scanner and the second connector is connectable to the electronic device, wherein the cable is coiled on a first part of the drum part, wherein the elastic cord is configured to apply a force to the drum part for rotating the (Continued)

drum part in a coiling direction of rotation about the rotation axis thereby coiling the cable on the first part of the drum part.

20 Claims, 4 Drawing Sheets

(51) Int. Cl.
  *G01R 33/36* (2006.01)
  *G01R 33/567* (2006.01)
  *G02B 6/44* (2006.01)
  *H02G 11/02* (2006.01)
(58) Field of Classification Search
  USPC ........................................................ 324/322
  See application file for complete search history.

(56) References Cited

U.S. PATENT DOCUMENTS

| | | |
|---|---|---|
| 2001/0029049 A1 | 10/2001 | Walt |
| 2002/0040945 A1 | 4/2002 | Stepancich |
| 2002/0128083 A1* | 9/2002 | Kleimeyer ............... B66D 1/02 |
| | | 472/131 |
| 2004/0081404 A1 | 4/2004 | Elliott |
| 2005/0049491 A1 | 3/2005 | Rezzonico |
| 2006/0055559 A1 | 3/2006 | Leonard |
| 2008/0030195 A1 | 2/2008 | Hagen |
| 2008/0196538 A1* | 8/2008 | Morimoto ................ F16C 1/26 |
| | | 74/502.5 |
| 2010/0006082 A1 | 1/2010 | Glinski |
| 2012/0059242 A1 | 3/2012 | Caruba |
| 2013/0003496 A1 | 1/2013 | Berg |
| 2013/0163932 A1 | 6/2013 | Cooke |
| 2013/0281900 A1* | 10/2013 | Suarez .................... A61F 5/055 |
| | | 602/18 |
| 2014/0021803 A1 | 8/2014 | Harvey |
| 2014/0270800 A1* | 9/2014 | Masarik ............. H04B 10/801 |
| | | 398/131 |
| 2015/0135528 A1* | 5/2015 | Buchmann ............ H01B 13/14 |
| | | 29/742 |

FOREIGN PATENT DOCUMENTS

| | | | |
|---|---|---|---|
| CN | 204022105 U | * 12/2014 | |
| DE | 102005057936 A1 | * 11/2006 | ............. H01B 7/041 |
| EP | 2202552 | 6/2010 | |
| JP | 2009291297 A | * 12/2009 | |
| WO | 2016092409 | 6/2016 | |

OTHER PUBLICATIONS

Schell, J.-B. et al., "Towards a Hall effect magnetic tracking device for MRI*", 35th Annual International Conference of the IEEE EMBS Osaka, Japan, Jul. 3-7, 2013.

* cited by examiner

MEDICAL SCANNER ACCESSORY SYSTEM AND MEDICAL SCANNER

CROSS REFERENCE TO RELATED APPLICATIONS

This application is a continuation of U.S. Utility patent application Ser. No. 16/465,048, filed May 29, 2019, which is the U.S. national phase application based on PCT/EP2017/080914 filed Nov. 30, 2017, which claims priority to European Application No. 16201439.3, filed Nov. 30, 2016, the entire contents of all of which is hereby incorporated by reference.

The present invention relates to a medical scanner accessory system for use with a medical scanner in a scanning room. Further, a medical scanner comprising the medical scanner accessory system is also disclosed.

BACKGROUND

Scanning rooms with medical scanners typically have restricted dimensions allowing little space for accessory devices. Further, the restricted space leaves little room for scanning personnel. Further, a scanning room has strict hygiene requirements and safety rules to be complied with. Further, motorized equipment is in general unwanted, e.g. in an MR scanner environment.

A medical scanner typically has a scanner table movably arranged in relation to the scanner tunnel in order to move a patient in and out of the scanner tunnel. A scanner coil, such as a RF head coil, may be attached, e.g. slidably attached to the scanner table. The developments within medical scanner accessory systems has revealed a need for attaching an end of a cable to the scanner table or to a part moving with the scanner table.

US 2014/0218030 relates to an MR receive coil platform with selective engagement between receive coil and patient table top. A cable management system can include a cable and/or conductor system connecting the electrical and/or optical connectors of the table top to a data acquisition system. The cable and/or conductor system includes a cable take-up system, such as a spring loaded spindle around which the cable is wrapped.

US 2012/0059242 relates to a hybrid MR/PET scanner with patient table split cable feed. A cable slack may be taken up by one or more cable reels within an RF shielding cage of known construction, and oriented in front or rear table supports.

US 2008/0030195 relates to a connection device for connecting electronics of a head coil arranged on a patient support to a connector location provided on the patient support.

"Towards a Hall effect magnetic tracking device for MRI*", by Schell, J.-B. et al., 35th Annual International Conference of the IEEE EMBS Osaka, Japan, 3-7 Jul. 2013 relates to a magnetic tracking device for Magnetic Resonance Imaging.

"MR-Compatible Optical Tracking Device with Active Markers", by Klarhöfer, M. et al., Proc. Intl. Soc. Mag. Reson. Med. 13 (2005) relates to passive optical tracking systems to determine position and orientation of static or moving objects.

SUMMARY

There is a need for medical scanner accessory systems and methods that take up little space. Further, there is a need for medical scanner accessory systems requiring little or no scanning personnel interaction.

Further, there is a need for systems for handling cables and in particular cables comprising optical fibre bundles with an end attached or attachable to a movable part, e.g. scanner table, of a medical scanner in a scanning room.

Accordingly, a medical scanner accessory system for a medical scanner is provided, wherein the medical scanner accessory system comprises a base part; a drum part rotatably connected to the base part, the drum part having a rotation axis and optionally configured for accommodating a device, such as an electronic device, e.g. a motion tracking device; a coiling mechanism comprising a first coiling part and a second coiling part; an elastic cord with a first point attached to the base part and a second point attached to the drum part, wherein the elastic cord is coiled on the coiling mechanism; and a cable comprising a jacket, wherein the cable has a first connector at a first end and a second connector at a second end thereof, wherein the first connector is connectable to a movable part of the medical scanner and the second connector is optionally connectable to the (electronic) device, wherein the cable is coiled on a first part of the drum part. The elastic cord is configured to apply a force to the drum part for rotating the drum part in a coiling direction of rotation about the rotation axis thereby coiling the cable on the first part of the drum part.

Also disclosed is a medical scanner comprising a medical scanner accessory system as disclosed herein. Thus, the medical scanner accessory system may be built into a medical scanner, such as an MR scanner, a PET scanner, or an MR/PET scanner.

The present invention provides easy, secure, un-motorized and/or automatic handling of cables, such as electrical cables, optical cables with optical fibre bundles, and/or medical tubing, optionally including tubes for IV lines, by enabling automatic coiling and/or uncoiling of the cable when the scanner table is moved. When the scanner table or other movable part of the medical scanner is moved in a first direction, the cable is pulled in uncoiling direction and the cable is uncoiled by the drum part being rotated in an uncoiling direction of rotation. An elastic cord coiled on a coiling mechanism is stretched and thus applies a force/torque in a coiling direction of rotation for the drum part. Thus, when the scanner table is moved in a second direction opposite the first direction, the cable is coiled on the drum part being rotated by the elastic cord. It is an important advantage of the present invention that the accessory system is suitable for use with an MR scanner. Further, the present invention allows compact handling of cables/optical fibre bundles in a scanning room.

It is an advantage of the present disclosure that the risk of a cable disturbing a scanning procedure in a scanning room is reduced or even eliminated. The present disclosure ensures that the cable is removed from the scanner tunnel when the scanner table moves into a scanning position.

Further, the present disclosure provides controlled and stable handling of cables in a scanning room without colliding or interfering with the image acquisition of the medical scanner.

BRIEF DESCRIPTION OF THE DRAWINGS

The above and other features and advantages of the present invention will become readily apparent to those skilled in the art by the following detailed description of exemplary embodiments thereof with reference to the attached drawings, in which.

DETAILED DESCRIPTION

Figure 1:
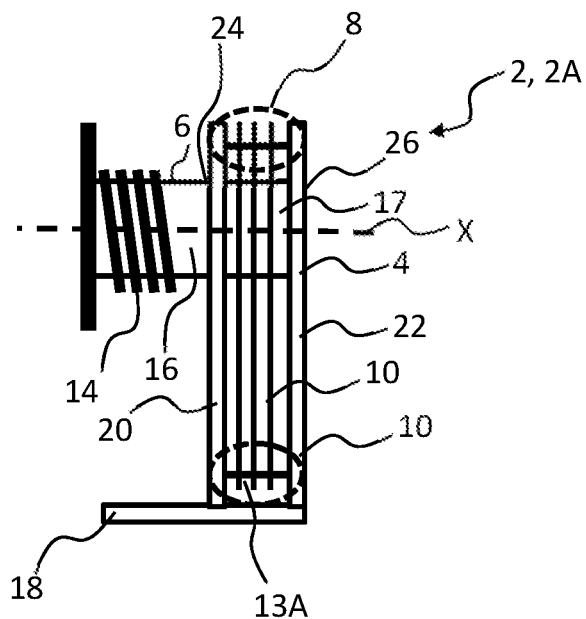
FIG. 1 schematically illustrates an exemplary medical scanner accessory system.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

The medical scanner accessory systems and methods disclosed herein are for medical scanners in general, and in particular medical scanners where a scanner table is movably arranged in relation to a scanner tunnel in order to move a patient in and out of the scanner tunnel. The medical scanner may be an MR scanner, a PET scanner and/or a combined MR/PET scanner or other medical scanners.

The medical scanner accessory system comprises a base part. The base part may comprise a foot plate and/or one or more frame parts including a first frame part and/or a second frame part. The base part may be provided with wheels and/or one or more handles to facilitate easy transport of the medical scanner accessory system. A part of a medical scanner may constitute the base part of the medical scanner accessory system, e.g. in an exemplary medical scanner, where the medical scanner accessory system is embedded or incorporated in the medical scanner.

The medical scanner accessory system comprises a drum part rotatably connected to the base part. The drum part has a rotation axis and may accommodate or be configured to accommodate an electronic device, such as a motion tracking device configured to track scanning subject motion in the medical scanner. The electronic device may be or comprise a display device, e.g. comprising a display unit and/or a projector unit. The electronic device may be or comprise a camera device, e.g. comprising an image detector. The electronic device may comprise one or more detectors for measuring and/or determining one or more parameters during a scanning session. The electronic device may comprise a battery for powering the electronic device during a scanning session. The drum part and/or electronic device may comprise a slip ring connector for powering the electronic device and/or electrically connecting the cable to a stationary power source. Thus, the drum part is configured to rotate about the rotation axis. The drum part may comprise a first part and a second part. In one or more exemplary medical scanner accessory systems, the drum part comprises a gear mechanism arranged between the first part and the second part. The first part and the second part may be fixed to each other. The first part and the second part may have the same rotation axis.

The medical scanner accessory system comprises a coiling mechanism. The coiling mechanism comprises one or a plurality of coiling parts including a first coiling part and optionally a second coiling part. The coiling mechanism may comprise a third coiling part and optionally a fourth coiling part. Three or more coiling parts provide less wear on the elastic cord by reducing the contact between the elastic cord and a respective coiling part.

A coiling part comprises a shaft and optionally a set of guide wheels. The guide wheel(s) of the set of guide wheels are rotatably arranged on the shaft, either separately and/or group wise. A set of guide wheels may comprise one or more guide wheels, such as one, two, three, four, five, six or more guide wheels. One or more guide wheels of a set of guide wheels may be slidably arranged on the shaft, i.e. the guide wheel(s) is/are able to move in the longitudinal direction of the shaft. A slidably arranged guide wheel may facilitate coiling of the elastic cord on a second part of the drum part. Guide wheels rotatably arranged on the shaft of a coiling part provides reduced wear on the elastic cord during coiling and uncoiling. A guide wheel may be a recessed guide wheel. A recessed guide wheel comprises a recess along the circumference of the guide wheel. A coiling part may comprise one or more bearings between the shaft and respective guide wheels. Thus, the internal resistance in the coiling mechanism may be reduced in turn lowering the requirements to and/or the wear on the elastic cord.

Further, the medical scanner accessory system comprises an elastic cord with a first point, such as a first end, attached to the base part or to the coiling mechanism. It is to be noted, that the first point or end of the elastic cord may be attached to any part of the base part, such as a coiling part or a frame part. In one or more exemplary medical scanner accessory systems, the medical scanner accessory system comprises a locking device for releasably fixing the elastic cord in an extended position, thus allowing an operator to easily adjust and control the force that is applied to the drum part during coiling and uncoiling of the cable.

A second point, such as a second end, of the elastic cord is attached to the drum part, such as the second part of the drum part. The elastic cord is coiled on one or more coiling parts of the coiling mechanism. The elastic cord may have a length of 0.3 m or at least 0.5 m, such as at least 1 m. In one or more exemplary medical scanner accessory systems, the elastic cord has a length (from first point to second point) in the range from 1 m to 10 m, such as from 2 m to 8 m, e.g. 6 m. The elastic cord may be characterized by a stretchability of a least 1.2, i.e. the elastic cord can be stretched to a length of a least 1.2 times of the length of the un-tensioned elastic cord. The elastic cord may be characterized by a stretchability of a least 1.3. The elastic cord may have a stretchability in the range from 1.3 to 5, such as from 1.8 to 3.

The elastic cord is configured to apply a force to the drum part for rotating the drum part in a coiling direction of rotation about the rotation axis. Thus, when the drum part (first part of the drum part) from an initial or first state is rotated in an uncoiling direction of rotation (scanner table moved in a first direction thereby pulling the cable in uncoiling direction), the elastic cord is extended and in response to the extension of the elastic cord, the elastic cord applies a force to the drum part for rotating the drum part (first part) in a coiling direction of rotation when the scanner table is moved in a second direction opposite the first direction, thereby coiling the cable on the drum part being rotated by the elastic cord. Thereby, automatic coiling of the cable is provided without the use of motor power or any metallic driving means.

Also, the medical scanner accessory system may comprise or is connectable to a cable comprising a jacket. The cable has a first connector at a first end and/or a second connector at a second end thereof. The first connector is connectable to a scanner table or other movable element, such as a scanner coil device, of the medical scanner. For example, a holder may be attached, e.g. glued and/or mechanically mounted, on the scanner table, and the holder may be connected to the first connector of the cable. The second connector is connected or connectable to the electronic device, e.g. a motion tracking device configured to track scanning subject motion in the medical scanner. The cable may, at least in a first or initial state, be coiled on the first part of the drum part. When the first part of the drum part is rotated in the uncoiling direction, e.g. by means of the scanner table moving to a position outside the medical scanner, the cable is uncoiled from the first part, and the elastic cord is extended and coiled on the second part of the drum part. For, example, when the scanner table is moved to a position inside the medical scanner, the elastic cord may apply a force to the second part of the drum part, thereby moving the first part in a coiling direction of rotation in turn coiling the cable on the first part. The medical scanner accessory system controls the trajectory of the cable and prevents undesired bending and external wear on the cable during scanner table movement. The medical scanner accessory system may be configured or arranged with the medical scanner, such that the first state (cable coiled on the first part of drum) of the medical scanner accessory system corresponds to a position of the scanner table inside the medical scanner and the second state (cable uncoiled from the first part of drum) of the medical scanner accessory system corresponds to a position of the scanner table outside the medical scanner or vice versa.

In the first state of the medical scanner accessory system, the cable is at least partly coiled, such as at least 50% coiled on the first part of the drum part.

In the first state of the medical scanner accessory system, the elastic cord may be pre-tensioned, e.g. having a length at least 10% longer than the length of the un-tensioned elastic cord. A pre-tensioned elastic cord facilitates improved control of the force applied to the drum part during uncoiling/coiling of the cable.

In a second state or uncoiled state of the medical scanner accessory system, the cable is at least partly uncoiled, such as at least 50% uncoiled from the first part of the drum part. The medical scanner accessory system may be in the second state when the cable is at least 80% uncoiled from the first part of the drum part. In the second state of the medical scanner accessory system, the elastic cord may have a length in the range from 30% to 70%, such as 50%, larger than the length of the un-tensioned elastic cord. In the second state of the medical scanner accessory system, the elastic cord may have a length at least 50% larger than the length of the un-tensioned elastic cord, such as at least 80% larger than the length of the un-tensioned elastic cord.

The drum part comprises a first part for coiling the cable thereon. The first part may have a cylindrical or conical outer surface. The outer surface of the first part may have a constant or varying cross-section along the rotation axis. The outer surface of the first part may have a circular cross-section with a first outer radius, e.g. in the range from 25 mm to 400 mm, such as in the range from 50 mm to 200 mm. Other first part cross-sectional shapes such as oval may also be employed. In one or more exemplary medical scanner accessory systems, the first outer radius may be larger than 30 cm, e.g. if the medical scanner accessory system is embedded in a medical scanner and the cable is coiled around the scanner tunnel/borehole of the medical scanner.

The coiling mechanism comprises a first coiling part. The first coiling part comprises a first shaft. The first coiling part may comprise a first set of first guide wheels rotatably arranged on the first shaft. The first set of guide wheels comprises one or a plurality of first guide wheels, such as two, three, four, five, six or more first guide wheels. One or more, e.g. all, of the first guide wheels may be a recessed guide wheel. The elastic cord may be coiled on the first guide wheels and/or on the first shaft.

The coiling mechanism comprises a second coiling part. The second coiling part comprises a second shaft. The second coiling part may comprise a second set of second guide wheels rotatably arranged on the second shaft. The second set of guide wheels comprises one or a plurality of second guide wheels, such as two, three, four, five, six or more second guide wheels. One or more, e.g. all, of the second guide wheels may be a recessed guide wheel. The elastic cord may be coiled on the second guide wheels and/or on the second shaft.

The elastic cord is optionally coiled on at least one or more of the first guide wheels and/or on at least one or more of the second guide wheels. The elastic cord may be coiled on at least one guide wheel of a coiling part. The elastic cord may be coiled on the shaft of a coiling part.

The first shaft and the second shaft may be parallel or at least form an angle less than 20 degrees.

In general, the distance between two coiling parts, such as the distance between the first coiling part and the second coiling part, is larger than 10 cm.

The distance between the first shaft and the second shaft may be at least 10 cm such as at least 30 cm. Thus, a long elastic cord may be coiled in a compact space.

The first shaft and the rotation axis of the drum part may form an angle less than 20 degrees, e.g. the first shaft and the rotation axis of the drum part may be parallel. The first shaft and the rotation axis of the drum part may be perpendicular.

The coiling mechanism may comprise a third coiling part. The third coiling part may comprise a third shaft. The third coiling part may comprise a third set of third guide wheels rotatably arranged on the third shaft. The third set of guide wheels comprises one or a plurality of third guide wheels, such as two, three, four, five, six or more third guide wheels. One or more, e.g. all, of the third guide wheels may be a recessed guide wheel.

The elastic cord is optionally coiled on at least one or more of the third guide wheels and/or on the third shaft.

The third shaft and the first shaft may be parallel or at least form an angle less than 20 degrees.

The distance between the first shaft and the third shaft may be at least 10 cm such as at least 30 cm. The distance between the second shaft and the third shaft may be at least 10 cm such as at least 30 cm.

The third shaft and the rotation axis of the drum part may form an angle less than 20 degrees, e.g. the third shaft and the rotation axis of the drum part may be parallel. The third shaft and the rotation axis of the drum part may be perpendicular.

The coiling mechanism may comprise a fourth coiling part. The fourth coiling part may comprise a fourth shaft and a fourth set of fourth guide wheels rotatably arranged on the fourth shaft. The fourth set of guide wheels comprises one or a plurality of fourth guide wheels, such as two, three, four, five, six or more fourth guide wheels. One or more, e.g. all, of the fourth guide wheels may be a recessed guide wheel.

The elastic cord is optionally coiled on at least one or more of the fourth guide wheels and/or on the fourth shaft.

The fourth shaft and the first shaft may be parallel or at least form an angle less than 20 degrees.

The distance between the first shaft and the fourth shaft may be at least 10 cm such as at least 30 cm. The distance between the second shaft and the fourth shaft may be at least 10 cm such as at least 30 cm. The distance between the third shaft and the fourth shaft may be at least 10 cm such as at least 30 cm.

The fourth shaft and the rotation axis of the drum part may form an angle less than 20 degrees, e.g. the fourth shaft and the rotation axis of the drum part may be parallel. The fourth shaft and the rotation axis of the drum part may be perpendicular.

The coiling mechanism or parts thereof may be made of plastic and/or non-magnetic material. The drum part may comprise or be made of a plastic material. The base part may be made of plastic and/or non-magnetic material. The base part may be made of a wooden material. The coiling mechanism or parts thereof may be made of a wooden material.

The elastic cord is optionally coiled on the coiling parts around the second part of the drum part. Coiling part shafts parallel with the rotation axis of the drum part advantageously allows for a compact medical scanner accessory system, even if a very long elastic cord and/or cable is required.

Further, the coiling mechanism provides a compact accommodation of the elastic cord while allowing extension of the elastic cord substantially with little or reduced external wear on the elastic cord.

Further, the coiling mechanism may comprise three or more coiling parts providing a reduced wear on the elastic cord during extension and/or shortening. At least four coiling parts may be preferred to allow large bending angles of the elastic cord (=less contact with guide wheel) on respective coiling parts, e.g. of at least 85 degrees.

The drum part comprises a second part, e.g. for coiling the elastic cord thereon. The second part may have a cylindrical or conical outer surface. The outer surface of the second part may have a circular cross-section with a second outer radius, e.g. in the range from 5 cm to 30 cm. Other second part cross-sectional shapes such as oval may also be employed. The elastic cord may at least in a second state of the medical scanner accessory system be coiled on the second part of the drum part.

The outer surface of the second part may have a constant or varying cross-section along the rotation axis. The second part may have a second primary outer radius at a second primary position along the rotational axis and a second secondary outer radius at a second secondary position along the rotational axis, wherein the second primary outer radius is different from such as larger than the second secondary outer radius.

The elastic cord is configured to apply a force to the drum part for rotating the drum part or at least the first part of the drum part in a coiling direction of rotation about the rotation axis. The elastic cord may be configured to apply a force in the range from 0.5 N to 200 N. For example, the elastic cord may in the first state apply a force in the range from 0 N to 100 N, such as in the range from 0.5 N to 50 N. For example, the elastic cord may in the second state apply a force in the range from 0.5 N to 200 N, such as in the range from 30 N to 150 N, e.g. 40 N, 60 N, 80 N, 100 N, 120 N or any range therebetween. In one or more exemplary medical scanner accessory systems, the elastic cord may in the second state apply a force in the range from 40 N to 100 N. Taking the radius of the second part into consideration, the elastic cord may be configured to apply a torque to the drum part in the range from 0 Nm to 200 Nm.

The cable may comprise an optical fibre bundle inside the jacket. The optical fibre bundle may comprise at least 1,000 optical fibres. The cable may comprise one or more optical fibres. The cable may comprise one or more wires. The cable may comprise an electrical shield. The present medical scanner accessory system is advantageous in providing a smooth and controlled uncoiling and/or coiling of the cable with no or heavily reduced shock loads on the cable. This is in particular advantageous, when a stable and rigid fixation on the scanner table is desired and/or when the cable comprises an optical fibre bundle due to the brittleness and sensitivity of optical fibres. The cable may be or comprise medical tubing, such as tubes comprising one or more fluid channels for transport of fluid, such as gas and/or liquid.

The medical scanner accessory system may comprise one or more bearings supporting the drum part on the base part. For example, the medical scanner accessory system may comprise a first bearing supporting the drum part on the base part, wherein the first bearing is optionally arranged between the first part and the second part of the drum part along the rotation axis. The first bearing may be arranged at an end of the drum part. The medical scanner accessory system may comprise a second bearing supporting the drum part on the base part. The second bearing may be arranged at an end of the drum part.

The drum part may comprise a cavity that is shielded with an electrical conductive material such as a metallic film or metallic structure, and wherein the electronic device, such as the motion tracking device, is or can be accommodated in the cavity. The electrical device may comprise other conductive components such as a heat sink or battery. The shielding may be cylindrical with a circular cross-section. The conductive components may be a part of the shielding and/or be symmetrical located around the axis of rotation. A rotationally symmetrical shielding and/or other conductive components may allow rotation of the drum part without affecting the magnetic fields within a scanner room including avoiding or reducing Eddy Current generation. Further, symmetric and/or evenly distributed para-magnetic material may reduce the resistance to rotation in a large magnetic field, e.g. as in an MR scanner. The electronic device may comprise a heat sink, housing and other metallic components arranged near or symmetrically around the rotation axis of the drum part or at least with a centre of mass near (e.g. less than 5 cm from) the rotation axis of the drum part. Thus, paramagnetic effects may be reduced or substantially eliminated and reduced resistance to rotation in a large magnetic field may be provided.

The figures are schematic and simplified for clarity, and they merely show details which are essential to the understanding of the invention, while other details have been left out. Throughout, the same reference numerals are used for identical or corresponding parts.

FIG. 1 is a schematic side view of exemplary medical scanner accessory systems 2, 2A for a medical scanner. The medical scanner accessory system comprises a base part 4 and a drum part 6 rotatably connected to the base part 4, the drum part 6 having a rotation axis X and accommodating an electronic device in the form of a motion tracking device (not shown). Further, the medical scanner accessory systems 2, 2A or the base part 4 comprises a coiling mechanism comprising a first coiling part indicated by dotted oval 8 and a second coiling part indicated by dotted oval 10; an elastic cord 12 with a first point or end 13A attached to the base part 4 (second coiling part 10) and a second point or end (see 13B in FIGS. 2 and 3) attached to the drum part 6, wherein the elastic cord is coiled on the coiling mechanism; and a cable 14 coiled on a first part 16 of the drum part 6. The elastic cord 12 has a stretchability larger than 1.5 and a length of at least 3 m.

The cable 14 optionally comprises a jacket, wherein the cable has a first connector at a first end and a second connector at a second end thereof, wherein the first connector is connectable to a scanner table or other movable part of the medical scanner and the second connector is connected or connectable to the motion tracking device. The elastic cord 12 is attached to a second part 17 of the drum part 6 and configured to apply a force to the drum part 6 for rotating the drum part 6 or at least the first part 16 of the drum part 6 in a coiling direction of rotation about the rotation axis.

The base 6 comprises a foot plate 18 or foot frame and a first frame part 20 and a second frame part 22, the frame parts 20, 22 extending from the foot plate 18. The medical scanner accessory systems 2, 2A comprise a first bearing 24 arranged between the drum part 6 and the first frame part 20 and supporting the drum part on the base part. The first bearing 24 is arranged between the first part 16 and the second part 17 of the drum part 6 along the rotation axis X. The medical scanner accessory systems comprise a second bearing 26 arranged between the drum part 6 and the second frame part 22, the second bearing supporting the drum part on the base part. The drum part 6 comprises a hollow cylindrical member with a circular cross-section having an outer radius of 20 cm, a centre axis of the cylinder coinciding with the rotation axis. The cable 14 is coiled on the outer surface of the cylindrical member.

Figure 2:
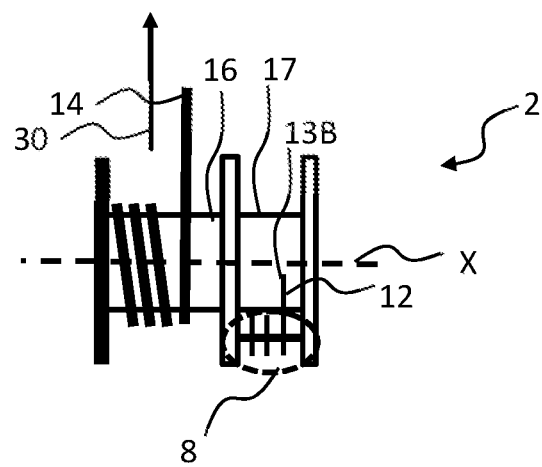
FIG. 2 schematically illustrates an exemplary medical scanner accessory system.

FIG. 2 is a schematic top view of the medical scanner accessory system 2 for a medical scanner. The elastic cord 12 is attached to the second part 17 and in the illustrated first or initial state, the cable 14 is coiled on the first part 16. When the first end of the cable is pulled, e.g. by a scanner table moving from a scanning position to a position enabling the patient to be arranged on the scanner table, in the direction indicated by arrow 30, the drum part 6 is rotated in the uncoiling direction about the rotation axis X and the cable is uncoiled from the drum part as illustrated in FIG. 3 illustrating the medical scanner accessory system 2 in a second state.

Figure 3:
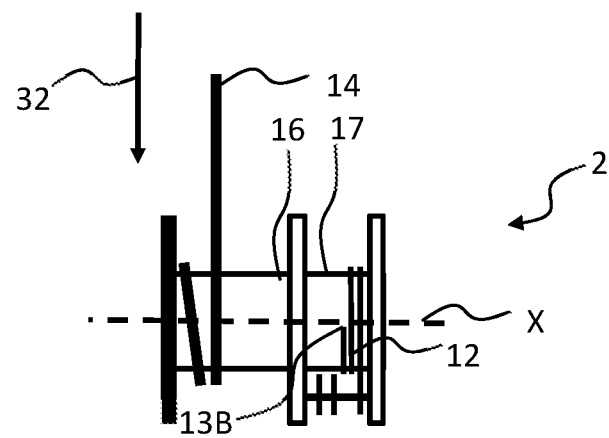
FIG. 3 schematically illustrates an exemplary medical scanner accessory system.

FIG. 3 is a schematic top view of the medical scanner accessory system 2 in a second state where the cable 14 is uncoiled from the first part 16, e.g. at least 50% of the cable is not coiled on the first part. The elastic cord 12 has been extended and coiled on the second part 17 of the drum part. Thereby, the elastic cord applies a force to the second part of the drum part for rotating the first part of the drum part in a coiling direction of rotation about the rotation axis. Accordingly, the elastic cord 12 will rotate the first part of the drum part in the coiling direction of rotation when the tension on the cable is released, e.g. when a scanner table moves into the scanning position. Thus, the cable 14 will be pulled by the elastic cord in the direction indicated by arrow 32 and coiled on the first part thereby avoiding that the uncoiled part of the cable curls or is twisted and possibly disturbing the scanning procedure or preventing a correct scanning procedure.

Figure 4:
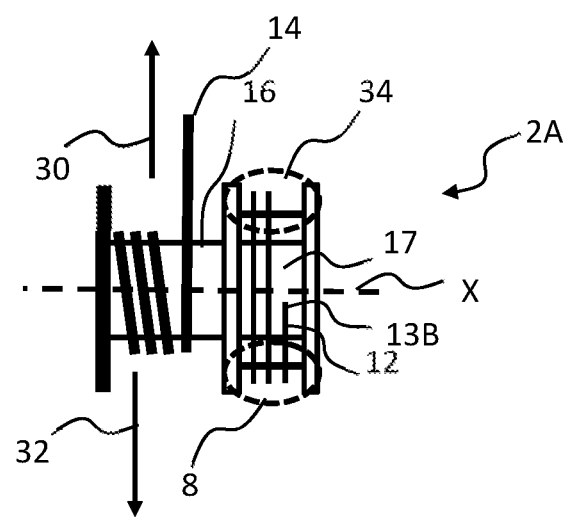
FIG. 4 schematically illustrates an exemplary medical scanner accessory system.

FIG. 4 is a schematic top view of the medical scanner accessory system 2A for a medical scanner. The coiling mechanism comprises a third coiling part (33, not shown in FIG. 4) and a fourth coiling part indicated by dotted oval 34. The elastic cord 12 is coiled on guide wheels of the coiling parts 8, 10, 33, 34, such that the part of the elastic cord that is coiled on the coiling mechanism encircles the second part of the drum part. This allows for a long elastic cord while providing a compact system. It may be desired to be able to use a long elastic cord since the relative extension of the elastic cord from a first state to a second state can be reduced for a given cable length. The third and fourth coiling parts have respective shafts parallel to or with an angle less than 20 degrees to the rotation axis X.

Figure 5:
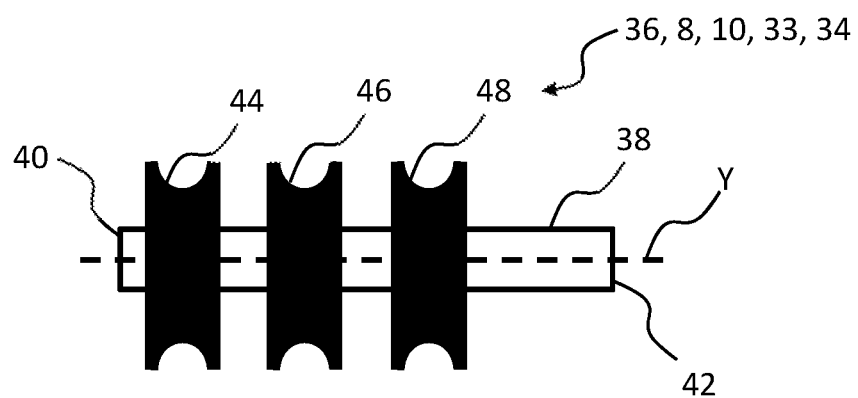
FIG. 5 schematically illustrates an exemplary coiling part.

FIG. 5 illustrates an exemplary coiling part. The coiling part 36 may be used as first coiling part 8, second coiling part 10, third coiling part 33 and/or fourth coiling part 34, e.g. as illustrated in relation to medical scanner accessory systems 2 and 2A. The coiling part 36 comprises a shaft 38, also denoted first, second, third, and fourth shaft respectively for coiling parts 8, 10, 33, 34. The shaft has a first end 40 and a second end 42. Typically, first end 40 is attached to the first frame part 20 as illustrated for medical scanner accessory systems 2 and 2A. The second end 42 is optionally attached to the second frame part 22 as illustrated for medical scanner accessory systems 2 and 2A. The shaft 38 may be fixed or rotatably attached to the frame parts 20, 22. Further, the coiling part 36 optionally comprises a set of guide wheels comprising one or more guide wheels. The guide wheels 44, 46, 48 are rotatably arranged on the shaft 38 around guide part axis Y and the elastic cord 12 is coiled on the guide wheels. Typically, axes X and Y are parallel. The rotatable guide wheels enable extension of the elastic cord with reduced wear on the elastic cord, in turn increasing the life time of the elastic cord. A coiling part with at least two, such as three, four, five or more guide wheels may allow for the elastic cord to be coiled in an effective way.

The guide wheels 44, 46, 48 are recessed guide wheels, i.e. each guide wheel 44, 46, 48 has a circumferential recess to accommodate the elastic cord. A guide wheel may comprise a plurality of circumferential recesses to accommodate different parts of the elastic cord. The guide wheels 44, 46, 48, or at least one of them, are slidably arranged on the shaft 38 and thus the guide wheels 44, 46, 48 is able to move in the longitudinal direction of the shaft 38 along Y, in turn allowing or providing a more even distribution of the elastic cord 12 when coiled on the second part of the drum part.

A medical scanner accessory system with three or more coiling parts may be preferred. For example, one or more exemplary medical scanner accessory systems has two, three or four coiling parts, each coiling part having from three to ten guide wheels, such as three, four or five guide wheels. In one or more exemplary medical scanner accessory systems, at least two coiling parts have a different number of guide wheels.

Figure 6:
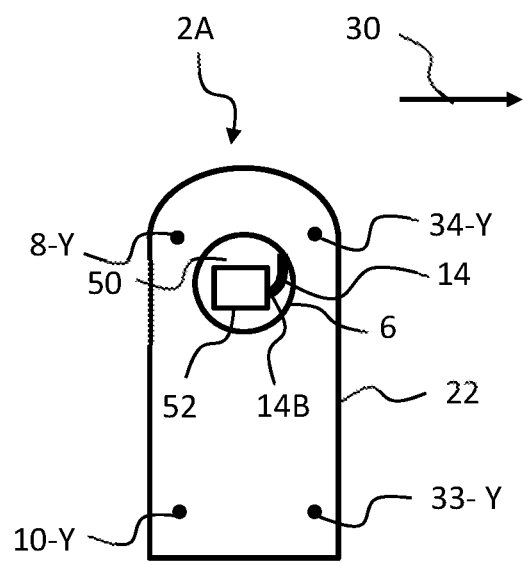
FIG. 6 schematically illustrates an exemplary medical scanner accessory system, and FIG. 7 schematically illustrates a medical scanner and the medical scanner accessory system.

FIG. 6 shows an end view of the medical scanner accessory system 2A. The drum part 6 comprises a cavity 50 that is optionally shielded with a metallic film or metallic structure e.g. on an inner surface of the drum part. The motion tracking device 52 is accommodated in the cavity 50. In the illustrated example, the drum part has open ends, however one or both ends may be closed. The motion tracking device 52 is connected to the second connector 14B of the cable for feeding signals such as optical signals in and/or out of the cable 14. The cable enters the cavity 50 via an opening in the outer surface of the first part of the drum part. The guide part axes 8-Y, 10-Y, 33-Y, 34-Y of respective guide parts 8, 10, 33, 34 are indicated with dots. The guide part axes 8-Y, 10-Y, 33-Y, 34-Y are mutually parallel and also parallel with the rotation axis of the drum part.

Figure 7:
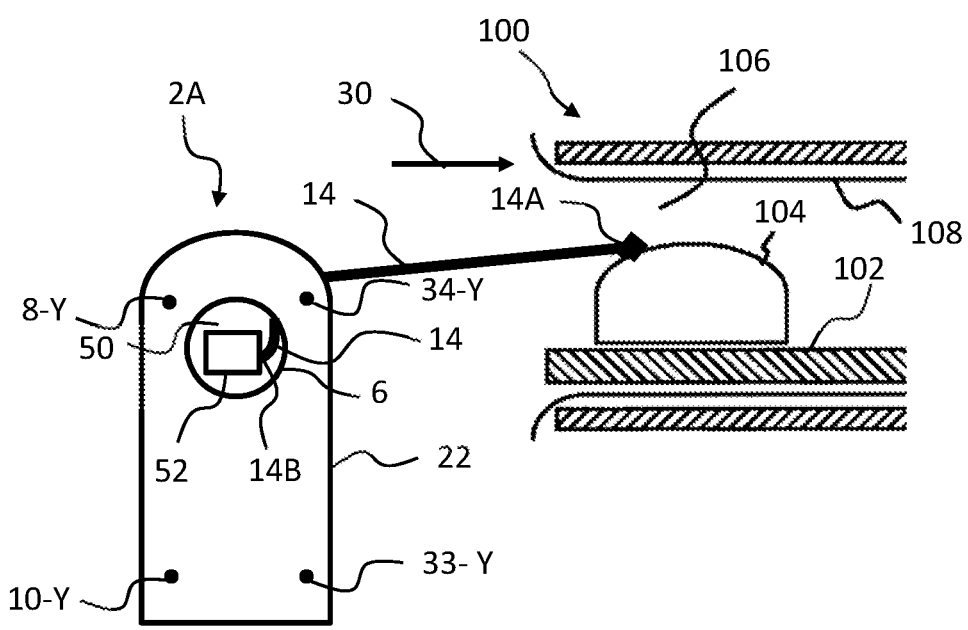

FIG. 7 illustrates a schematic side view of a medical scanner accessory system 2A and a medical scanner 100. The medical scanner 100 comprises a scanner table 102 with a head coil 104 mounted thereon. The head coil may be movably mounted on the scanner table or alternatively movably mounted to a stationary base frame of the medical scanner. The first connector 14A of cable 14 is connected to the movable head coil 104. Thus, the head coil/scanner table pulls the cable 14 in pulling direction 30, e.g. when the scanner table 102 is moved out of the scanner tunnel 106, e.g. in order to place a scanning subject on the scanner table 102.

The use of the terms "first", "second", "third" and "fourth", etc. does not imply any particular order, but are included to identify individual elements. Moreover, the use of the terms first, second, etc. does not denote any order or importance, but rather the terms first, second, etc. are used to distinguish one element from another. Note that the words first and second are used here and elsewhere for labelling purposes only and are not intended to denote any specific spatial or temporal ordering. Furthermore, the labelling of a first element does not imply the presence of a second element and vice versa.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

LIST OF REFERENCES 2 medical scanner accessory system
4 base part
6 drum part
8 first coiling part
10 second coiling part
12 elastic cord
13A first point or end of elastic cord
13B second point or end of elastic cord
14 cable coiled on a first part of the drum part
14A first connector of cable
14B second connector of cable
16 first part of drum part
17 second part of drum part
18 foot plate
20 first frame part
22 second frame part
24 first bearing
26 second bearing
30 pulling direction of scanner table
32 pulling direction of drum part
33 third coiling part
34 fourth coiling part
36 coiling part
38 shaft
40 first end
42 second end
44 primary guide wheel
46 secondary guide wheel
48 tertiary guide wheel
50 cavity of drum part
52 electronic device, motion tracking device
100 medical scanner
102 Scanner table
104 RF head coil
106 scanner borehole
108 scanner housing
X rotation axis
Y guide part axis
8-Y guide part axis of first guide part
10-Y guide part axis of second guide part
33-Y guide part axis of third guide part
34-Y guide part axis of fourth guide part

We claim:

1. A medical scanner accessory system for a medical scanner comprising a scanner tunnel and a scanner table movably arranged in relation to the scanner tunnel, wherein the medical scanner accessory system comprises:
a base;
a drum rotatably connected to the base, the drum having a drum rotation axis and configured for accommodating a motion tracking device;
a coiler connected to the base and including a first coiling shaft and a second coiling shaft, wherein the first coiling shaft includes a first plurality of guide wheels rotatably arranged on the first coiling shaft and having a first coiling shaft rotation axis, wherein the second coiling shaft includes a second set of one or more guide wheels rotatably arranged on the second coiling shaft and having a second coiling shaft rotation axis;
an elastic cord with a first point attached to the base and a second point attached to the drum, wherein the elastic cord is configured to be coiled on the coiler; and
a cable including a jacket, wherein the cable has a first connector at a first end and a second connector at a second end thereof, wherein the first connector is configured to be connectable to the scanner table or another portion movable with the scanner table and the second connector is configured to be connectable to the motion tracking device, wherein the cable is configured to be coiled on a first section of the drum;
wherein the elastic cord is configured to apply a force to the drum for rotating the drum in a coiling direction of rotation about the rotation axis thereby coiling the cable on the first section of the drum.

2. A medical scanner accessory system for a medical scanner comprising scanner tunnel and a scanner table movably arranged in relation to the scanner tunnel, wherein the medical scanner accessory system comprising
a base;
a drum rotatably connected to the base the drum having a rotation axis and comprises a first section and a second section;
a coiler connected to the base and comprises a first coiling shaft and a second coiling shaft;
an elastic cord; and
a cable comprising a jacket, wherein the cable has a first connector at a first end and a second connector at a second end thereof,
wherein the first coiling shaft comprises at least one first guide wheel rotatably arranged on the first coiling shaft and having a first coiling shaft rotation axis,
wherein the second coiling shaft comprises at least one second guide wheel rotatably arranged on the second coiling shaft and having a second coiling shaft rotation axis, wherein the distance between the first guide wheel and the second guide wheel is at least 10 cm, wherein the cable is configured to be coiled onto the first section of the drum with a first coiling direction of rotation about the rotation axis of the drum and to be coiled of from the first section of the drum with a second coiling direction of rotation about the rotation axis of the drum opposite to the first coiling direction of rotation, and wherein the elastic cord is configured to be coiled onto the second section of the drum with the second coiling direction of rotation about the rotation axis of the drum, wherein the elastic cord has a first attachment point and a second attachment point, the second attachment point being attached to the drum to provide that the elastic cord is stretched when coiled onto the second section of the drum with the second coiling direction of rotation about the rotation axis of the drum.

3. A medical scanner accessory system for a medical scanner, wherein the medical scanner accessory system comprising a rotatable drum with a first section for coiling of a cable and a second section and an elastic cord with a first attachment point and a second attachment point and having a length of at least 1 m between the first attachment point and the second attachment point the, wherein the rotatable drum having a first coiling direction of rotation about a rotation axis of the drum and an opposite second rotation direction about a rotation axis of the drum, wherein the second attachment point of the cord is being attached to the drum to provide that the elastic cord is stretched when coiled onto the second section of the drum with the second coiling direction of rotation about the rotation axis of the drum, wherein the scanner accessory further comprises a coiler comprises a first coiling shaft and a second coiling shaft, wherein the first coiling shaft comprises at least one first guide wheel rotatably arranged on the first coiling shaft and the second coiling shaft comprises at least one second guide wheel rotatably arranged on the second coiling shaft wherein the distance between the first guide wheel and the second guide wheel is at least 10 cm.

4. A assembly of a medical scanner and a medical scanner accessory system, wherein the medical scanner accessory system comprising a rotatable drum with a first section for coiling of a cable and a second section and an elastic cord with a first attachment point and a second attachment point and having a length of at least 2 m between the first attachment point and the second attachment point the, wherein the rotatable drum having a first coiling direction of rotation about a rotation axis of the drum and an opposite second rotation direction about a rotation axis of the drum, wherein the second attachment point of the cord is being attached to the drum to provide that the elastic cord is stretched when coiled onto the second section of the drum with the second coiling direction of rotation about the rotation axis of the drum, wherein the scanner accessory further comprises a coiler comprises a first coiling shaft and a second coiling shaft, wherein the first coiling shaft comprises at least one first guide wheel rotatably arranged on the first coiling shaft and the second coiling shaft comprises at least one second guide wheel rotatably arranged on the second coiling shaft wherein the distance between the first guide wheel and the second guide wheel is at least 10 cm and wherein the medical scanner comprising a scanner tunnel and a scanner table, wherein the scanner table is movably in and out of the scanner tunnel, the assembly further comprises a cable, wherein the cable has a first connector at a first end and a second connector at a second end thereof, wherein the first connector is configured to be connectable to the scanner table or to a scanner coil device located at the scanner table and the second connector is configured to be connectable to an electronic device and wherein the cable at least in a first stage is coiled onto the second section of the drum.

5. The medical scanner accessory system of claim 2, wherein the distance between the first guide wheel and the second guide wheel is at least 30 cm.

6. The medical scanner accessory system of claim 2, wherein the first attachment point of the elastic cord is attached to the base.

7. The medical scanner accessory system of claim 2, wherein the first attachment point of the elastic cord is attached to the coiler.

8. The medical scanner accessory system of claim 2, wherein the elastic cord is coiled on the at least one first guide wheel and the at least one second guide wheel between the first attachment point and the second attachment point.

9. The medical scanner accessory system of claim 2, wherein the first connector of the cable is configured to be connectable to the scanner table or another portion of the medical scanner movable with the scanner table and the second connector of the cable is configured to be connectable to a motion tracking device.

10. The medical scanner accessory system of claim 2, wherein the cable is selected from the group of an electrical cable, an optical cable and a medical tubing.

11. The medical scanner accessory system of claim 2, wherein the elastic cord has a length of at least 2 m between the first attachment point and the second attachment point.

12. The medical scanner accessory system of claim 2, wherein the drum part comprises a cavity that is shielded with an electrical conductive and configured to accommodate a motion tracking device.

13. A medical scanner accessory system of claim 3, wherein the system comprises a cable configured to be coiled onto the first section of the drum with the first coiling direction of rotation about the rotation axis of the drum and to be coiled of from the first section of the drum with the second coiling direction of rotation about the rotation axis of the drum opposite to the first coiling direction of rotation.

14. A medical scanner accessory system of claim 3, wherein the at least one first guide wheel rotatably arranged on the first coiling shaft comprises a first set of guide wheels including at least two first guide wheels wherein the elastic cord is coiled on said at least two first guide wheels.

15. A medical scanner accessory system of claim 3, wherein the coiler comprises a third coiling shaft comprising at least one third guide wheel, wherein said elastic cord is coiled on said at least two first guide wheels.

16. A medical scanner accessory system of claim 3, wherein the system comprises a base, said drum being rotatably connected to the base, said system comprises at least a first bearing supporting the drum part on the base part.

17. The assembly of claim 4, wherein the cable is arranged for being coiled when the drum is rotating in the first coiling direction and for being uncoiled when the drum is rotating in the second coiling direction.

18. The assembly of claim 4, wherein the cable is selected from the group of an electrical cable, an optical cable and a medical tubing.

19. The assembly of claim 4, wherein the cable comprises an optical fibre bundle and a jacket, the fiber bundle being located inside said jacket.

20. The assembly of claim 4, wherein the electronic device is a motion tracking device configured to track scanning subject motion in the medical scanner and wherein the medical scanner is selected from the group of a MR scanner, a PET scanner and a combined MR/PET scanner.

* * * * *